United States Patent
Watanabe et al.

(10) Patent No.: US 7,977,729 B2
(45) Date of Patent: Jul. 12, 2011

(54) AGING DEVICE

(75) Inventors: Hiroshi Watanabe, Yokohama (JP);
Atsuhiro Kinoshita, Kamakura (JP);
Shigeki Kobayashi, Tokyo (JP);
Daisuke Hagishima, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 245 days.

(21) Appl. No.: 12/173,535

(22) Filed: Jul. 15, 2008

(65) Prior Publication Data

US 2009/0020803 A1 Jan. 22, 2009

(30) Foreign Application Priority Data

Jul. 17, 2007 (JP) ................................. 2007-186343

(51) Int. Cl.
*H01L 29/788* (2006.01)
(52) U.S. Cl. ................... 257/316; 257/317; 257/E29.3
(58) Field of Classification Search .................. 257/316, 257/317, E29.3
See application file for complete search history.

(56) References Cited

U.S. PATENT DOCUMENTS

| | | | |
|---|---|---|---|
| 6,009,013 A * | 12/1999 | Van Houdt et al. | 365/185.14 |
| 6,133,098 A | 10/2000 | Ogura et al. | |
| 6,853,583 B2 | 2/2005 | Diorio et al. | |
| 7,075,284 B2 | 7/2006 | Watanabe et al. | |
| 7,208,933 B2 | 4/2007 | Watanabe et al. | |
| 7,224,157 B2 | 5/2007 | Watanabe et al. | |
| 7,248,034 B2 | 7/2007 | Watanabe et al. | |
| 2001/0001212 A1 | 5/2001 | Gambino et al. | |
| 2003/0137005 A1 | 7/2003 | Mitros et al. | |
| 2004/0164340 A1 | 8/2004 | Arai et al. | |
| 2005/0006697 A1 * | 1/2005 | Hsieh | 257/317 |
| 2005/0087795 A1 | 4/2005 | Sakuma et al. | |
| 2006/0081910 A1 | 4/2006 | Yu et al. | |
| 2006/0244434 A1 | 11/2006 | Watanabe et al. | |
| 2007/0158699 A1 | 7/2007 | Watanabe et al. | |
| 2008/0079057 A1 | 4/2008 | Hagishima et al. | |

FOREIGN PATENT DOCUMENTS

| | | |
|---|---|---|
| JP | 2004-172404 | 6/2004 |
| JP | 2005-310824 | 11/2005 |
| JP | 2007-184321 | 7/2007 |
| JP | 2008-305819 | 12/2008 |
| KR | 10-2007-0001454 | 1/2007 |

* cited by examiner

*Primary Examiner* — Tu-Tu V Ho
(74) *Attorney, Agent, or Firm* — Oblon, Spivak, McClelland, Maier & Neustadt, L.L.P.

(57) ABSTRACT

An aging device according to an embodiment of the present invention includes a semiconductor substrate, first and second diffusion layers provided in a first element region, a floating gate provided above a channel region between the first and second diffusion layers, and a control gate electrode provided beside the floating gate with an interval in the lateral direction. A coupling capacitance between the floating gate and the control gate electrode is larger than a coupling capacitance between the floating gate and the semiconductor substrate.

9 Claims, 12 Drawing Sheets

AGING DEVICE

CROSS-REFERENCE TO RELATED APPLICATIONS

This application is based upon and claims the benefit of priority from prior Japanese Patent Application No. 2007-186343, filed Jul. 17, 2007, the entire contents of which are incorporated herein by reference.

BACKGROUND OF THE INVENTION

1. Field of the Invention

The present invention relates to an aging device which is an electronic timer free from a battery.

2. Description of the Related Art

Recently, an electronic timer free from a battery, that is, an aging device in which output is varied as time passes is beginning to be used in the fields of content delivery, credit cards, rental of digital products, rental of digital software, and so on.

The aging device has a floating gate and operates as an electronic timer for measuring a certain period by using retention characteristics (life) of a charge in the floating gate (for example, see Jpn. Pat. Appln. KOKAI Publication Nos. 2004-172404 and 2005-310824).

According to the above aging device, for instance, the amount of the charge injected into the floating gate and the thickness of a tunnel insulating film are changed, whereby the life of the aging device can be changed.

There are two types of the aging devices: stack gate type and single-layer polysilicon type.

Since a basic structure of the stack gate type is the same as the basic structure of a memory cell of a flash memory, it is preferable that the stack gate type is adopted when the aging device is mounted on an IC with a built-in flash memory.

However, the aging device is also employed in an IC without a flash memory. In this case, it is preferable that the single-layer polysilicon type is adopted.

Jpn. Pat. Appln. KOKAI Publication No. 2007-184321 proposes the single-layer polysilicon type.

This single-layer polysilicon type is characterized in that a writing/erasing part (second element region) is provided in addition to an aging device part (first element region). In addition, a floating gate is disposed so as to cross over both the aging device part and the writing/erasing part.

Thus, a coupling capacitance between the floating gate and the first element region is rendered larger than a coupling capacitance between the floating gate and the second element region, whereby the charge is easily injected and ejected between the writing/erasing part (second element region) and the floating gate.

In the above single-layer polysilicon type, all the following patterns are required to be realized. This is because four basic operations, which are features of the aging device disclosed in Jpn. Pat. Appln. KOKAI Publication No. 2004-172404, can be realized.

[N-Channel]
Normally-On:
writing (injection of electrons to the floating gate) is performed at initialization. The aging device is off in a writing state (initial state), and on after a lapse of the life time.
Normally-Off:
erasing (ejection of electrons from the floating gate) is performed at initialization. The aging device is on in an erasing state (initial state), and off after a lapse of the life time.

[P-Channel]
Normally-On:
erasing (ejection of electrons from the floating gate) is performed at initialization. The aging device is off in the erasing state (initial state), and on after a lapse of the life time.
Normally-Off:
writing (injection of electrons to the floating gate) is performed at initialization. The aging device is on in the writing state (initial state), and off after a lapse of the life time.

In order to realize the normally-on in the N-channel type, positive high voltage is applied to an N-type diffusion layer in the first element region, which is the aging device part, in the writing. In order to improve the writing speed, although negative high voltage is also preferably applied to the N-type diffusion layer in the second element region as the writing/erasing part, it is difficult to simultaneously apply the positive and negative high voltages to the same semiconductor substrate.

In addition, in order to realize the normally-off in the N-channel type, the positive high voltage is applied to the N-type diffusion layer in the second element region, which is the writing/erasing part, in the erasing. In order to improve the erasing speed, although the negative high voltage is also preferably applied to the N-type diffusion layer in the first element region as the aging device part, it is difficult to do that for the reason described above.

Further, the same can be said for the case of realizing the normally-on and the normally-off in the P-channel type.

As above described, there is a problem that the speed of writing at initialization is not sufficiently increased in the prior art single-layer polysilicon type aging device.

BRIEF SUMMARY OF THE INVENTION

An aging device according to an aspect of the invention comprises a semiconductor substrate, an element isolation insulating layer formed in a surface region of the semiconductor substrate, a first element region surrounded by the element isolation insulating layer, first and second diffusion layers formed in the first element region, a channel region provided between the first and second diffusion layers, a floating gate formed above the channel region, a control gate electrode provided beside the floating gate with an interval in a lateral direction. A coupling capacitance between the floating gate and the control gate electrode is larger than a coupling capacitance between the floating gate and the semiconductor substrate.

DETAILED DESCRIPTION OF THE INVENTION

An aging device of an aspect of the present invention will be described below in detail with reference to the accompanying drawing.

1. Outline

In the examples of the invention, in a single-layer polysilicon type aging device (SSAD: solid state aging device), control gate electrodes are arranged at an interval in a lateral direction to a floating gate, and, at the same time, a coupling capacitance between the floating gate and a control gate electrode is rendered larger than a coupling capacitance between the floating gate and a semiconductor substrate.

In this case, first, since writing/erasing is performed in an aging device part, the aging device part and a writing/erasing part are not separated from each other, unlike the prior single-layer polysilicon type. Therefore, the device structure is simplified, and, at the same time, writing/erasing is easily controlled. In addition, the entire size of the aging device is reduced.

Second, the coupling capacitance between the floating gate and the control gate electrode is rendered larger than the coupling capacitance between the floating gate and the semiconductor substrate, whereby, when writing voltage is applied to the control gate electrode, the charge is effectively injected from the semiconductor substrate to the floating gate.

In the single-layer polysilicon type disclosed in Jpn. Pat. Appln. KOKAI Publication No. 2007-184321, since the writing/erasing part and the aging device part are different from each other, the coupling capacitance between the floating gate and the semiconductor substrate in the aging device part is set to be larger, contrary to the invention. This is a big difference between the invention and the invention disclosed in Jpn. Pat. Appln. KOKAI Publication No. 2007-184321.

Third, according to the structure of the invention, a voltage is applied to between the semiconductor substrate and the control gate electrode, whereby writing/erasing is performed. Therefore, a positive high voltage (or negative high voltage) is applied to the control gate electrode, and a negative high voltage (or positive high voltage) is applied to the semiconductor substrate, whereby the writing speed can be further increased.

As above, according to the structure in the examples of the invention, the single-layer polysilicon type aging device suitable for high-speed writing/erasing can be realized.

2. Embodiments (1) First Embodiment

A. Structure

Figure 1:
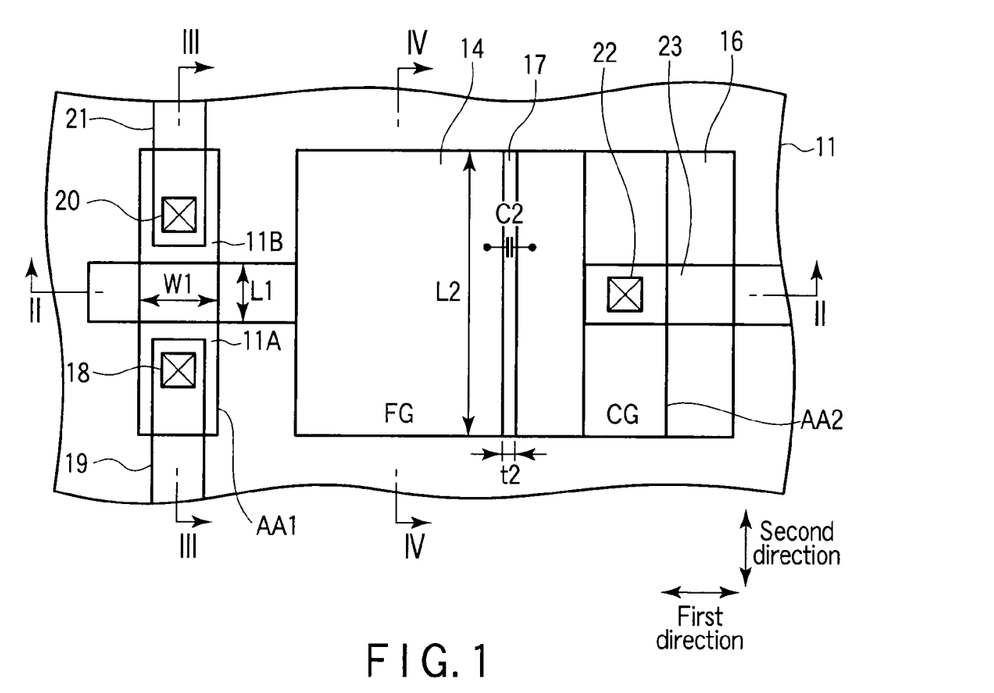
FIG. 1 is a plan view showing an aging device of a first embodiment.

FIG. 1 shows a plan view of an aging device of the first embodiment.

Figure 2:
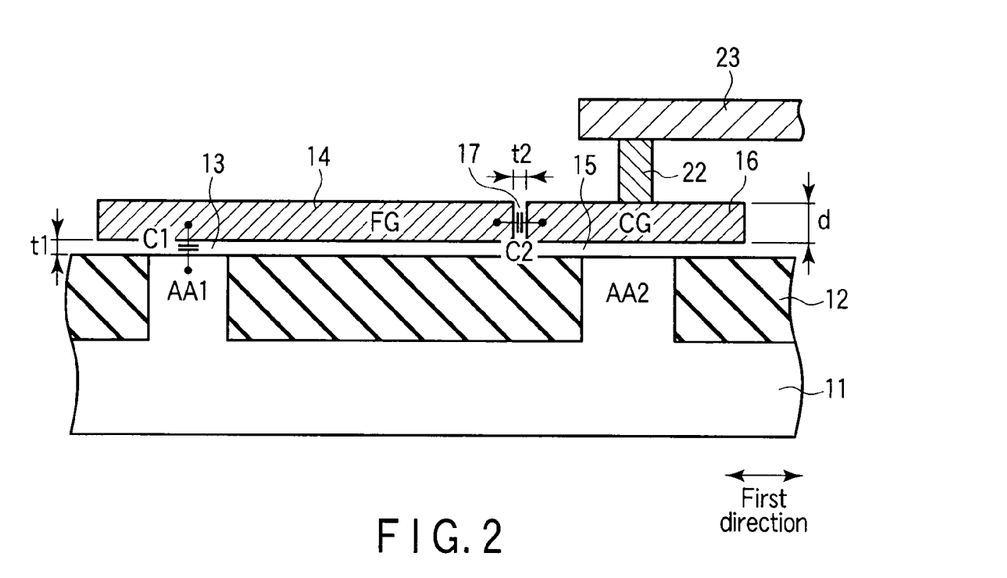
FIG. 2 is a cross-sectional view along a line II-II in FIG. 1.
Figure 3:
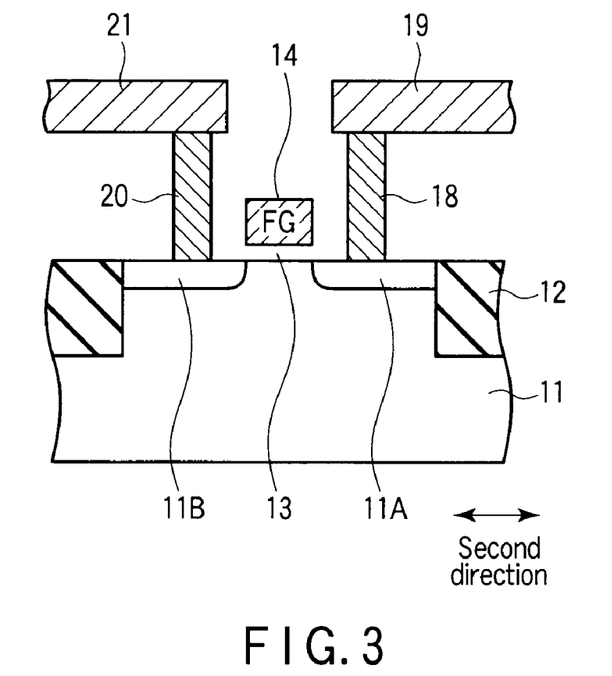
FIG. 3 is a cross-sectional view along a line III-III in FIG. 1.
Figure 4:
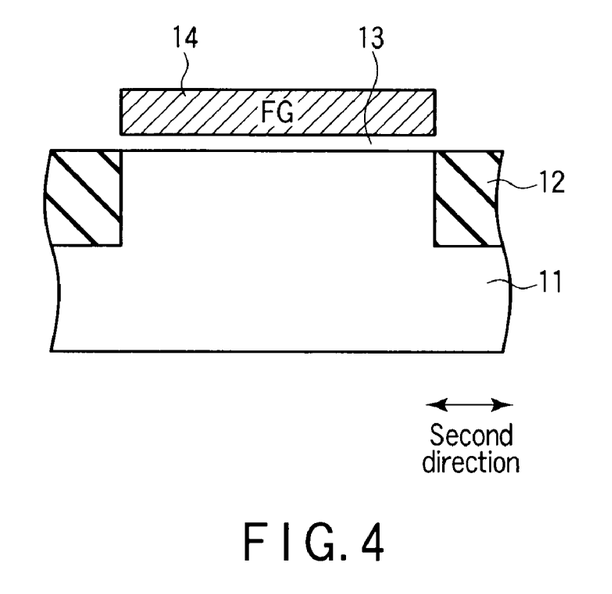
FIG. 4 is a cross-sectional view along a line IV-IV in FIG. 1.

FIG. 2 is a cross-sectional view along a line II-II in FIG. 1.
FIG. 3 is a cross-sectional view along a line III-III in FIG. 1.
FIG. 4 is a cross-sectional view along a line IV-IV in FIG. 1.

An element isolation insulating layer 12 with an STI (shallow trench isolation) structure is formed in a semiconductor substrate 11. First and second element regions (active areas) AA1 and AA2 are surrounded by the element isolation insulating layer 12 and disposed adjacent to each other in a first direction, for example. The width in the first direction of the first element region AA1 is W1.

Diffusion layers 11A and 11B are formed in the first element region AA1. The conductivity type of the diffusion layers 11A and 11B is opposite to the conductivity type of the semiconductor substrate 11. For instance, when the semiconductor substrate 11 is a p-type, the diffusion layers 11A and 11B are an n-type, and, when the semiconductor substrate 11 is the n-type, the diffusion layers 11A and 11B are the p-type.

A floating gate 14 with a thickness of d is formed above a channel region between the diffusion layers 11A and 11B at an interval t1. An area 13 between the first element region AA1 and the floating gate 14 is filled with a material or remains void.

A control gate electrode 16 is formed above the second element region AA2. An area 15 between the second element region AA2 and the control gate electrode 16 is filled with a material or remains void.

The floating gate 14 is disposed above the first element region AA1 and above the element isolation insulating layer 12 between the first and second element regions AA1 and AA2.

Regarding the width of the floating gate 14 in the second direction perpendicular to the first direction, the width on the first element region AA1 is L1, and the width in the part adjacent to the control gate electrode 16 is L2 (>L1).

The floating gate 14 and the control gate electrode 16 are adjacent to each other with an interval t2. An area 17 between the floating gate 14 and the control gate electrode 16 is filled with a material or remains void.

In this embodiment, a coupling capacitance C1 between the first element region AA1 and the floating gate 14 is $\varepsilon_1$ (L1×W1)/t1, and a coupling capacitance C2 between the floating gate 14 and the control gate electrode 16 is $\varepsilon_2$ (L2× d)/t2.

Wherein, $\varepsilon_1$ represents a dielectric constant of a material or a void in the area 13 between the first element region AA1 and the floating gate 14, and $\varepsilon_2$ represents a dielectric constant of a material or a void in the area 17 between the floating gate 14 and the control gate electrode 16.

In the invention, the capacitances C1 and C2 are set to satisfy the expression: C1<C2.

The diffusion layer 11A is connected to a first bit line 19 through a contact plug 18. Meanwhile, the diffusion layer 11B is connected to a second bit line 21 through a contact plug 20. The control gate electrode 16 is connected to a word line 23 through a contact plug 22.

In the above single-layer polysilicon type, a coupling ratio C2/(C1+C2) is substantially large. As the coupling ratio is larger, a voltage applied to between the substrate 11 and the floating gate 14 is larger when a writing voltage is applied to the control gate electrode 16, and therefore, a writing/erasing efficiency is improved.

B. Operation

The technique in a flash memory is used for writing (initializing) to the aging device of FIGS. 1 to 4. For instance, the voltage of the control gate electrode 16 is set to be a sufficiently higher than the voltage in the channel region, whereby an electron is injected from the channel region into the floating gate 14, using an FN (Fowler-Nordheim) tunneling.

The aging device measures a temporal change in the amount of the charge accumulated in the floating gate 14, that is, measures it for a certain period using a phenomenon where the voltage of the channel region is changed due to the charge leaking. In other words, the aging device monitors a temporal change (aging) in an electric current (drain current Id) flowing between the first bit line (drain electrode) 19 and the second bit line (source electrode) 21.

Incidentally, with regard to the writing, the amount of charge to be injected into the floating gate 14 can be controlled by a verify technique.

The amount of charge to be injected into the floating gate 14 can be properly controlled by using the verify technique.

C. Other

With regard to a variation in manufacturing the aging devices depending on the leakage characteristics, the leakage characteristics are examined before shipment, whereby it is possible to determine conditions of a method of writing (injection of charge) to a control device in accordance with the result of the examination of the leakage characteristics.

When the above method is adopted, the charge amount to be injected into the floating gate of the control device is changed, whereby the aging devices manufactured in the same line can be provided as the aging devices with different lifes.

Thus, users can set the life of the aging device using the above conditions in accordance with their purpose, and, at the same time, can control difference of each life caused by the variation in manufacturing.

In addition, an end user having purchased a product with the aging device mounted therein can use the product only during the period set by a provider of the product without knowing such a condition. More specifically, even if the end user connects the product to network or disconnects it from an external power supply, the user cannot use the product beyond the period set by the provider.

(2) Second Embodiment

The second embodiment is a variation of the first embodiment.

The second embodiment is characterized in that, with regard to a floating gate and a control gate electrode, concavities and convexities are formed in a part where the floating gate and the control gate electrode are faced to each other, whereby the coupling ratio is further improved.

Figure 5:
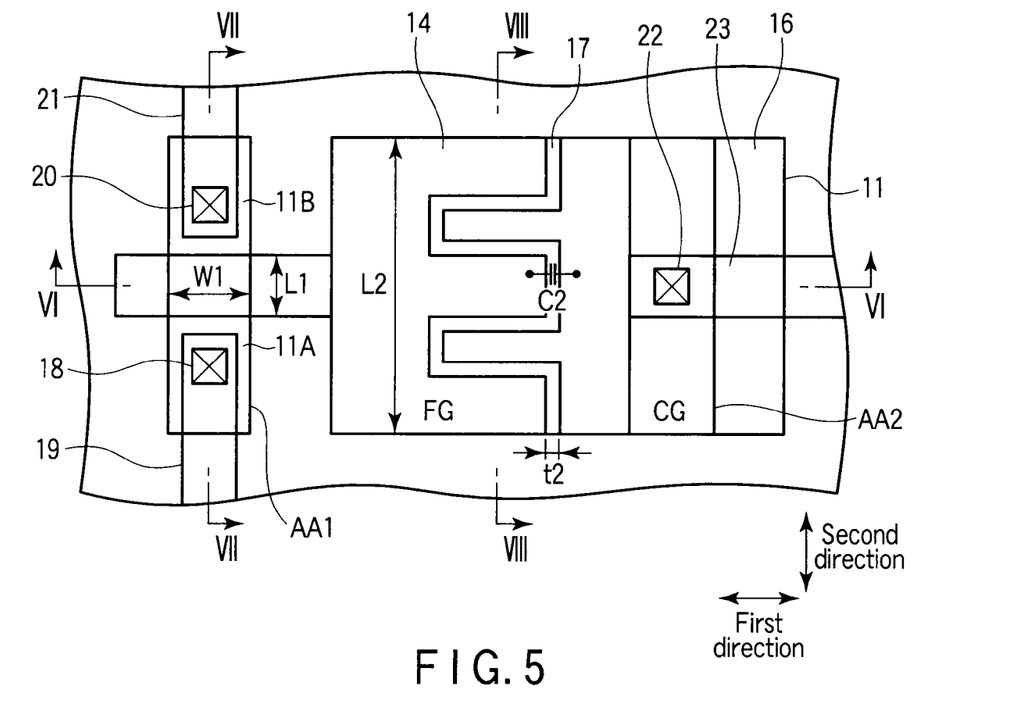
FIG. 5 is a plan view showing an aging device of a second embodiment.

FIG. 5 shows a plan view of an aging device of the second embodiment.

Figure 6:
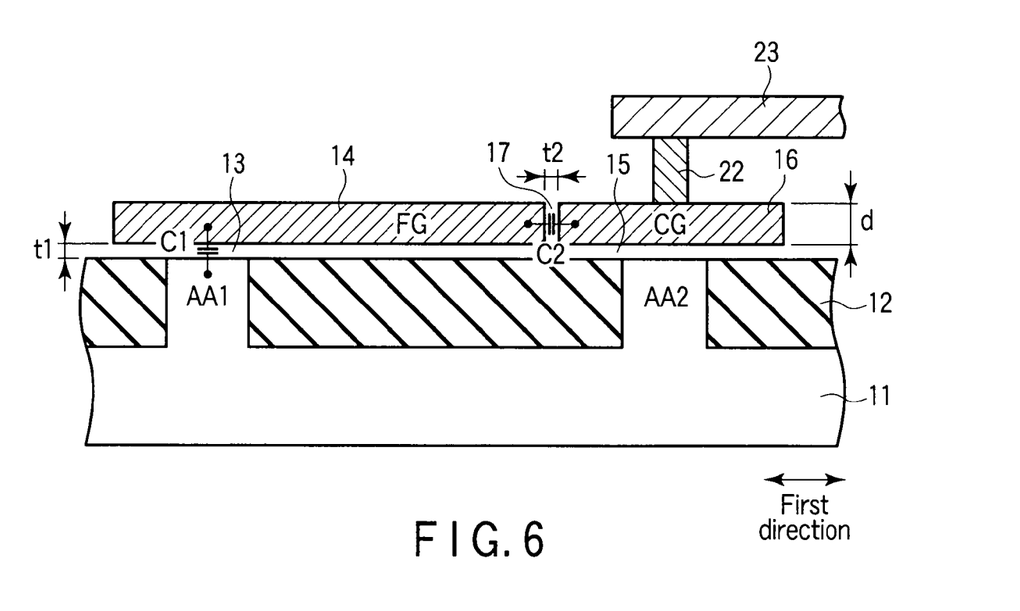
FIG. 6 is a cross-sectional view along a line VI-VI in FIG. 5.
Figure 7:
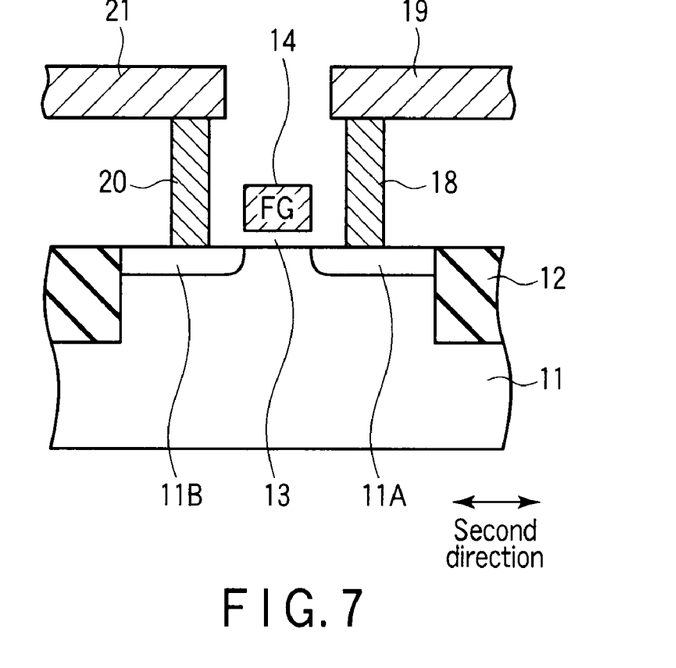
FIG. 7 is a cross-sectional view along a line VII-VII in FIG. 5.
Figure 8:
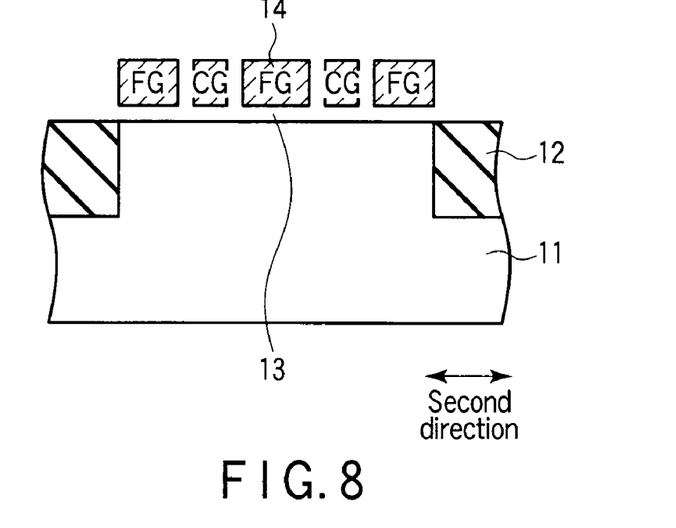
FIG. 8 is a cross-sectional view along a line VIII-VIII in FIG. 5.

FIG. 6 is a cross-sectional view along a line VI-VI in FIG. 5. FIG. 7 is a cross-sectional view along a line VII-VII in FIG. 5. FIG. 8 is a cross-sectional view along a line VIII-VIII in FIG. 5.

An element isolation insulating layer 12 with the STI structure is formed in a semiconductor substrate 11. First and second element regions (active areas) AA1 and AA2 are surrounded by the element isolation insulating layer 12, and, for example, disposed adjacent to each other in the first direction.

Diffusion layers 11A and 11B are formed in the first element region AA1. The conductivity type of the diffusion layers 11A and 11B is opposite to the conductivity type of the semiconductor substrate 11.

A floating gate 14 is formed above a channel region between the diffusion layers 11A and 11B. An area 13 between the first element region AA1 and the floating gate 14 is filled with a material or remains void.

A control gate electrode 16 is formed above the second element region AA2. An area 15 between the second element region AA2 and the control gate electrode 16 is filled with a material or remains void.

The floating gate 14 is disposed above the first element region AA1 and above the element isolation insulating layer 12 between the first and second element regions AA1 and AA2.

Regarding the width of the floating gate 14 in the second direction perpendicular to the first direction, the width on the first element region AA1 is L1, and the width in the part adjacent to the control gate electrode 16 is L2 (>L1).

The floating gate 14 and the control gate electrode 16 are adjacent to each other. Concavities and convexities are formed in a part where the floating gate 14 and the control gate electrode 16 are faced to each other.

An area 17 between the floating gate 14 and the control gate electrode 16 is filled with a material or remains void.

In this embodiment, as with the first embodiment, a coupling capacitance C2 between the floating gate 14 and the control gate electrode 16 is larger than a coupling capacitance C1 between the first element region AA1 and the floating gate 14 (=$\epsilon$1 (L1×W1)/t1).

Wherein, $\epsilon$1 represents a dielectric constant of a material or a void in the area 13 between the first element region AA1 and the floating gate 14.

The diffusion layer 11A is connected to a first bit line 19 through a contact plug 18. Meanwhile, the diffusion layer 11B is connected to a second bit line 21 through a contact plug 20. The control gate electrode 16 is connected to a word line 23 through a contact plug 22.

In the above single-layer polysilicon type, since the coupling capacitance C2 is larger than that of the first embodiment, a coupling ratio C2/(C1+C2) is further increased, contributing to the improvement of the writing/erasing efficiency.

(3) Third Embodiment

The third embodiment is a variation of the second embodiment.

The third embodiment is characterized in that the width of a floating gate in the second direction is kept constant, and, with regard to the floating gate and a control gate electrode, concavities and convexities are formed in a part where the floating gate and the control gate electrode are faced to each other.

Figure 9:
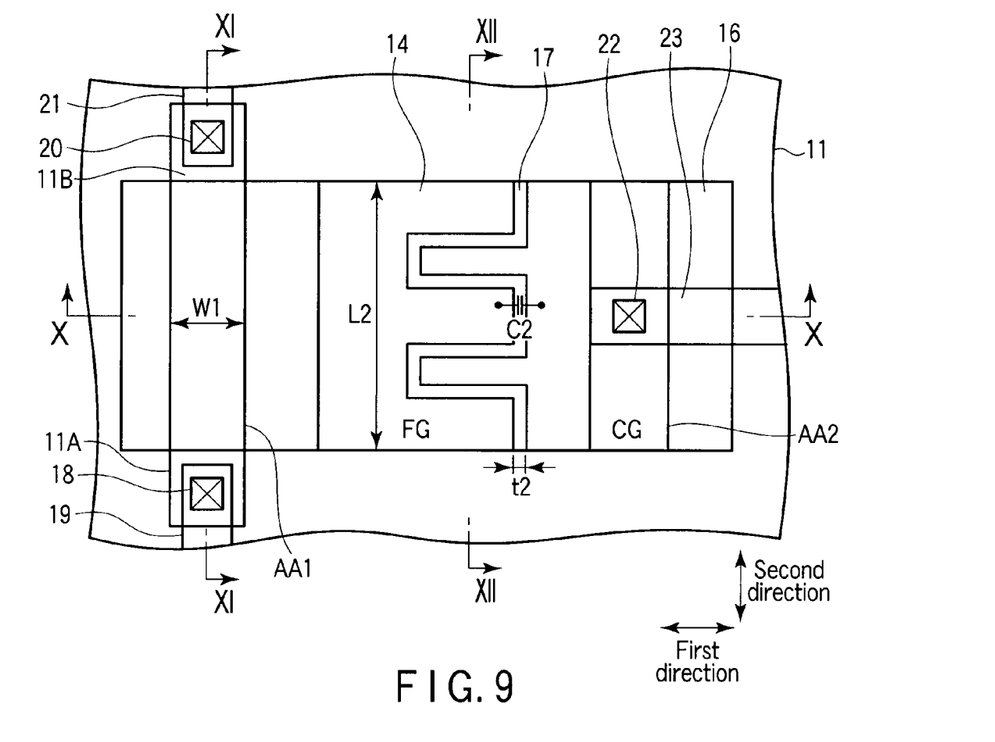
FIG. 9 is a plan view showing an aging device of a third embodiment.

FIG. 9 shows a plan view of an aging device of the third embodiment.

Figure 10:
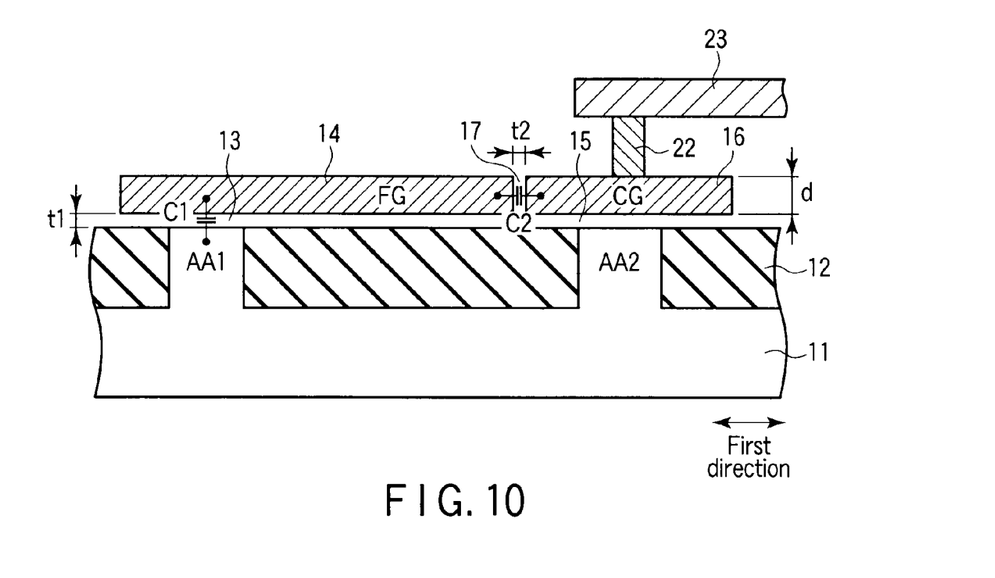
FIG. 10 is a cross-sectional view along a line X-X in FIG. 9.
Figure 11:
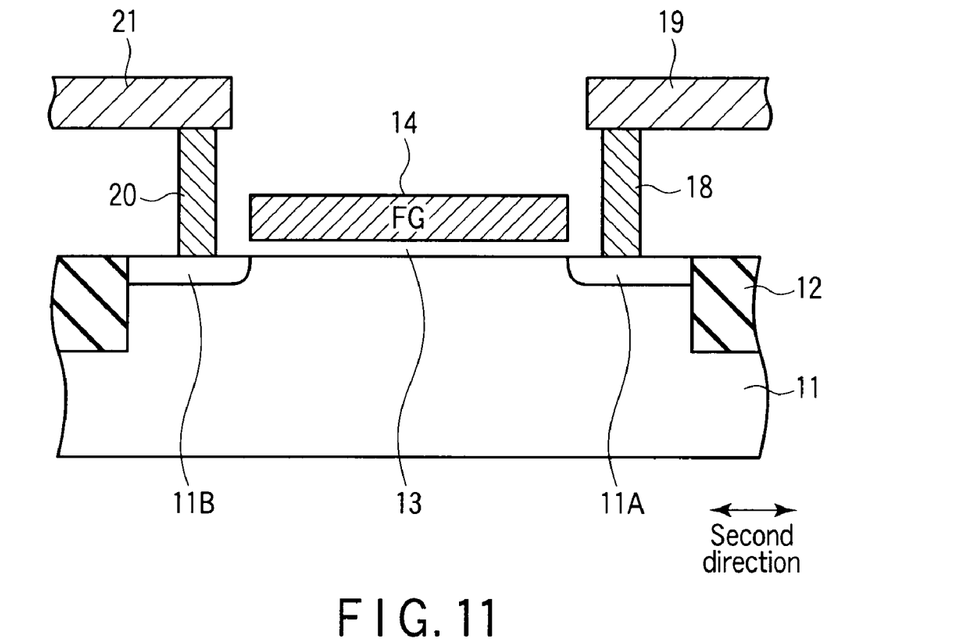
FIG. 11 is a cross-sectional view along a line XI-XI in FIG. 9.
Figure 12:
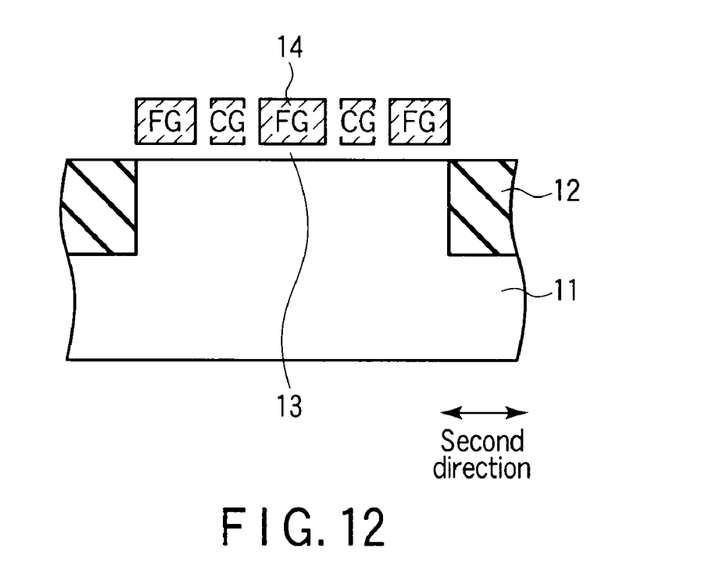
FIG. 12 is a cross-sectional view along a line XII-XII in FIG. 9.

FIG. 10 is a cross-sectional view along a line X-X in FIG. 9. FIG. 11 is a cross-sectional view along a line XI-XI in FIG. 9. FIG. 12 is a cross-sectional view along a line XII-XII in FIG. 9.

An element isolation insulating layer 12 with the STI structure is formed in a semiconductor substrate 11. First and second element regions (active areas) AA1 and AA2 are surrounded by the element isolation insulating layer 12, and, for example, disposed adjacent to each other in the first direction.

Diffusion layers 11A and 11B are formed in the first element region AA1. The conductivity type of the diffusion layers 11A and 11B is opposite to the conductivity type of the semiconductor substrate 11.

A floating gate 14 is formed above a channel region between the diffusion layers 11A and 11B. An area 13 between the first element region AA1 and the floating gate 14 is filled with a material or remains void.

A control gate electrode 16 is formed above the second element region AA2. An area 15 between the second element region AA2 and the control gate electrode 16 is filled with a material or remains void.

The floating gate 14 is disposed above the first element region AA1 and above the element isolation insulating layer 12 between the first and second element regions AA1 and AA2.

Regarding the width of the floating gate 14 in the second direction perpendicular to the first direction, both the width on the first element region AA1 and the width in the part adjacent to the floating gate 16 are L2.

The floating gate 14 and the control gate electrode 16 are adjacent to each other. Concavities and convexities are formed in a part where the floating gate 14 and the control gate electrode 16 are faced to each other.

An area 17 between the floating gate 14 and the control gate electrode 16 is filled with a material or remains void.

In the third embodiment, a coupling capacitance C2 between the floating gate 14 and the control gate electrode 16 is larger than a coupling capacitance C1 between the first element region AA1 and the floating gate 14 (=$\epsilon 1(L1 \times W1)/t1$).

Wherein, $\epsilon 1$ represents a dielectric constant of a material or a void in the area 13 between the first element region AA1 and the floating gate 14.

The diffusion layer 11A is connected to a first bit line 19 through a contact plug 18. Meanwhile, the diffusion layer 11B is connected to a second bit line 21 through a contact plug 20. The control gate electrode 16 is connected to a word line 23 through a contact plug 22.

In the above single-layer polysilicon type, since the expression: C1<C2 can be satisfied, a coupling ratio C2/(C1+C2) is sufficiently large, contributing the improvement of the writing/erasing efficiency.

(4) Fourth Embodiment

The fourth embodiment is a variation of the second embodiment.

The fourth embodiment is characterized in that the width of a floating gate on a first element region is L1 and the width at both ends of the first element region in a first direction is L2 (>L1).

Figure 13:
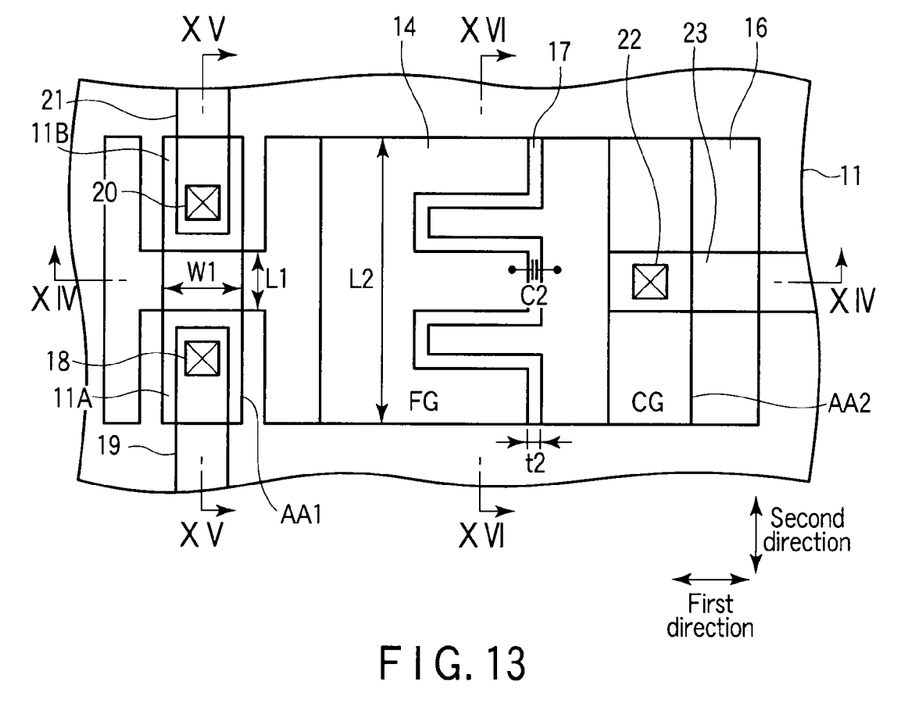
FIG. 13 is a plan view showing an aging device of a fourth embodiment.

FIG. 13 shows a plan view of an aging device of the fourth embodiment.

Figure 14:
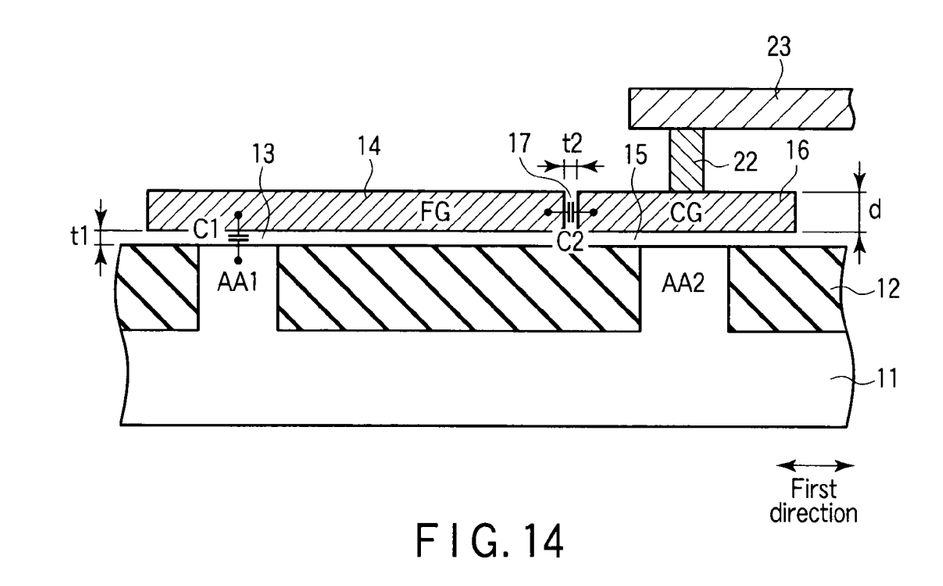
FIG. 14 is a cross-sectional view along a line XIV-XIV in FIG. 13.
Figure 15:
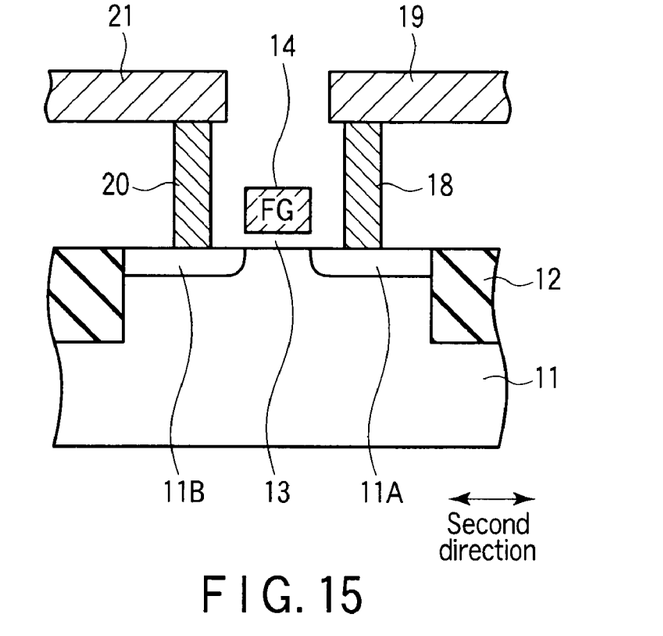
FIG. 15 is a cross-sectional view along a line XV-XV in FIG. 13.
Figure 16:
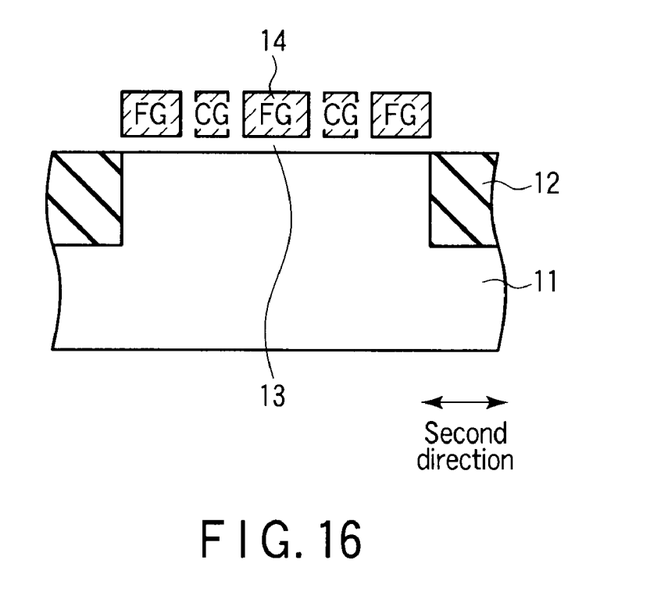
FIG. 16 is a cross-sectional view along a line XVI-XVI in FIG. 13.

FIG. 14 is a cross-sectional view along a line XIV-XIV in FIG. 13. FIG. 15 is a cross-sectional view along a line XV-XV in FIG. 13. FIG. 16 is a cross-sectional view along a line XVI-XVI in FIG. 13.

An element isolation insulating layer 12 with the STI structure is formed in a semiconductor substrate 11. First and second element regions (active areas) AA1 and AA2 are surrounded by the element isolation insulating layer 12, and, for example, disposed adjacent to each other in the first direction.

Diffusion layers 11A and 11B are formed in the first element region AA1. The conductivity type of the diffusion layers 11A and 11B is opposite to the conductivity type of the semiconductor substrate 11.

A floating gate 14 is formed above a channel region between the diffusion layers 11A and 11B. An area 13 between the first element region AA1 and the floating gate 14 is filled with a material or remains void.

A control gate electrode 16 is formed above the second element region AA2. An area 15 between the second element region AA2 and the control gate electrode 16 is filled with a material or remains void.

The floating gate 14 is disposed above the first element region AA1 and above the element isolation insulating layer 12 between the first and second element regions AA1 and AA2.

Regarding the width of floating gate 14 in the second direction perpendicular to the first direction, the width on the first element region AA1 is L1, and the width at the both ends of the first element region AA1 in the first direction and the width in the part adjacent to the control gate electrode 16 are respectively L2 (>L1).

The floating gate 14 and the control gate electrode 16 are adjacent to each other. Concavities and convexities are formed in a part where the floating gate 14 and the control gate electrode 16 are faced to each other.

An area 17 between the floating gate 14 and the control gate electrode 16 is filled with a material or remains void.

The diffusion layer 11A is connected to a first bit line 19 through a contact plug 18. Meanwhile, the diffusion layer 11B is connected to a second bit line 21 through a contact plug 20. The control gate electrode 16 is connected to a word line 23 through a contact plug 22.

In the above single-layer polysilicon type, as with the second embodiment, the writing/erasing efficiency is improved.

(5) Fifth Embodiment

The fifth embodiment is a variation of the first embodiment.

The fifth embodiment is characterized in that a high-dielectric constant material (High-k material) is formed between a floating gate and a control gate electrode, whereby the coupling ratio is improved.

Incidentally, the high-dielectric constant material is assumed to have a dielectric constant higher than that of oxide silicon and silicon nitride.

Figure 17:
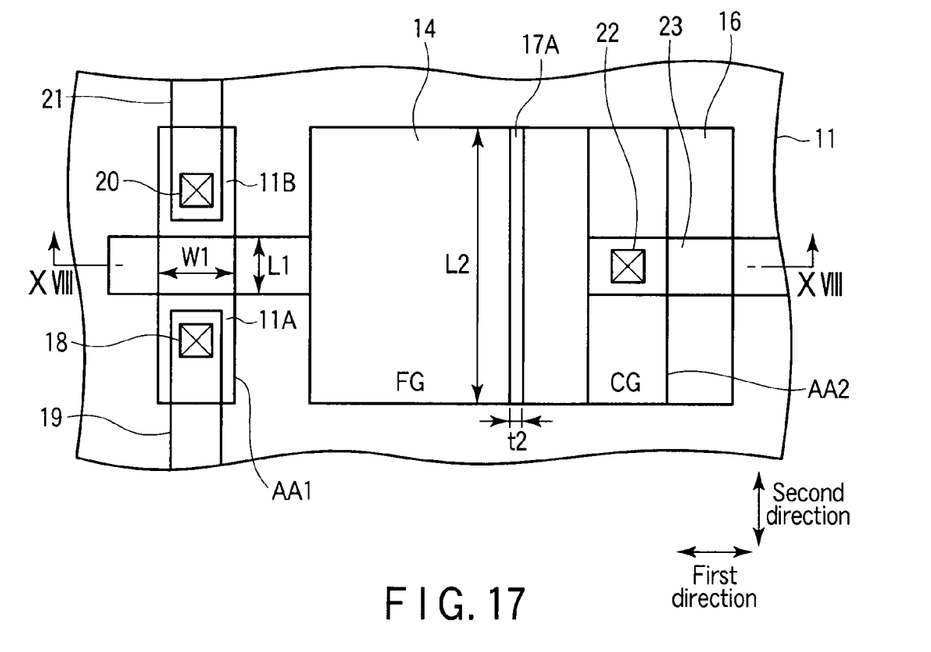
FIG. 17 is a plan view showing an aging device in a fifth embodiment.

FIG. 17 shows a plan view of an aging device of the fifth embodiment.

Figure 18:
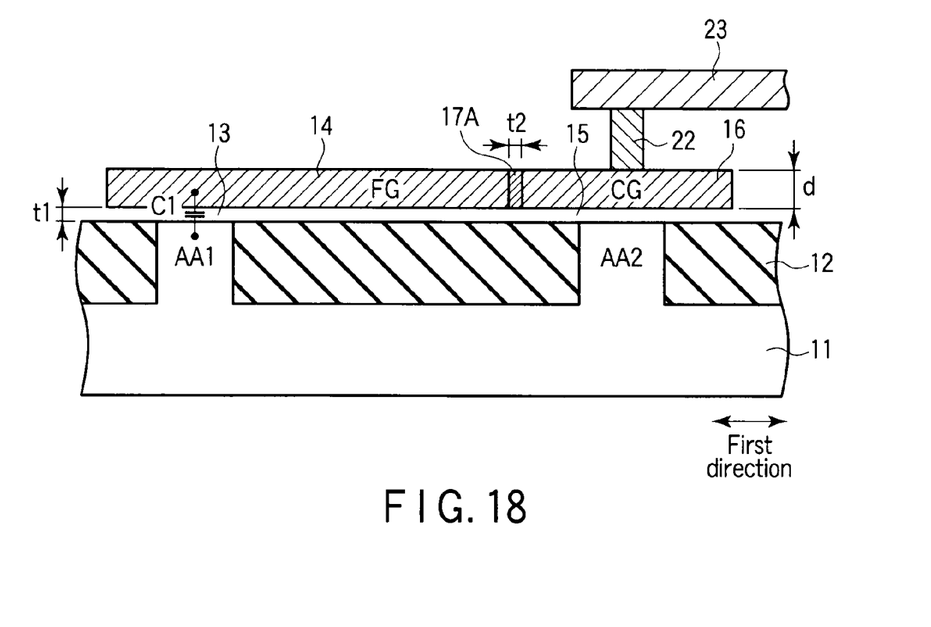
FIG. 18 is a cross-sectional view along a line XVIII-XVIII in FIG. 17.

FIG. 18 is a cross-sectional view along a line XVIII-XVIII in FIG. 17.

In this embodiment, since cross-sectional views corresponding to FIGS. 3 and 4 are the same as FIGS. 3 and 4, those views are omitted.

An element isolation insulating layer 12 with the STI structure is formed in a semiconductor substrate 11. First and second element regions (active areas) AA1 and AA2 are surrounded by the element isolation insulating layer 12, and, for example, disposed adjacent to each other in the first direction.

Diffusion layers 11A and 11B are formed in the first element region AA1. The conductivity type of the diffusion layers 11A and 11B is opposite to the conductivity type of the semiconductor substrate 11.

A floating gate 14 is formed above a channel region between the diffusion layers 11A and 11B. An area 13 between the first element region AA1 and the floating gate 14 is filled with a material or remains void.

A control gate electrode 16 is formed above the second element region AA2. An area 15 between the second element region AA2 and the control gate electrode 16 is filled with a material or remains void.

The floating gate 14 is disposed above the first element region AA1 and above the element isolation insulating layer 12 between the first and second element regions AA1 and AA2.

Regarding the width of the floating gate 14 in the second direction perpendicular to the first direction, the width on the first element region AA1 is L1, and the width in the part adjacent to the control gate electrode 16 is L2 (>L1).

The floating gate 14 and the control gate electrode 16 are adjacent to each other. An area 17A between the floating gate 14 and the control gate electrode 16 is filled with a high-dielectric constant material (High-k material).

The dielectric constant of the high-dielectric constant material is higher than the dielectric constant of a material or a void filled in the area 13 between the first element region AA1 and the floating gate 14.

As with the first to fourth embodiments, the diffusion layer 11A is connected to a first bit line 19 through a contact plug 18. Meanwhile, the diffusion layer 11B is connected to a second bit line 21 through a contact plug 20. The control gate electrode 16 is connected to a word line 23 through a contact plug 22.

In the above single-layer polysilicon type, since the coupling ratio is rendered large by the high-dielectric constant material, the writing/erasing efficiency is improved.

(6) Sixth Embodiment

The sixth embodiment is a variation of the fifth embodiment.

The sixth embodiment is characterized in that a high-dielectric constant material (High-k material) between a floating gate and a control gate electrode is sandwiched with an oxide film, a nitride oxide film, or an oxynitride film, whereby the reliability of an insulating layer is improved.

Figure 19:
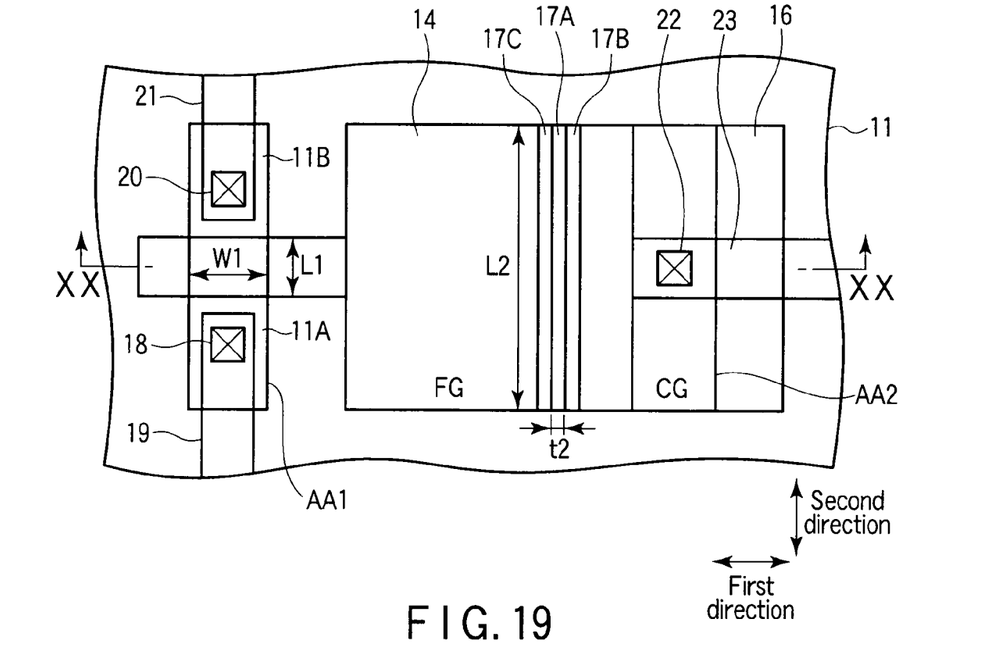
FIG. 19 is a plan view showing an aging device of a sixth embodiment.

FIG. 19 shows a plan view of an aging device in the sixth embodiment.

Figure 20:
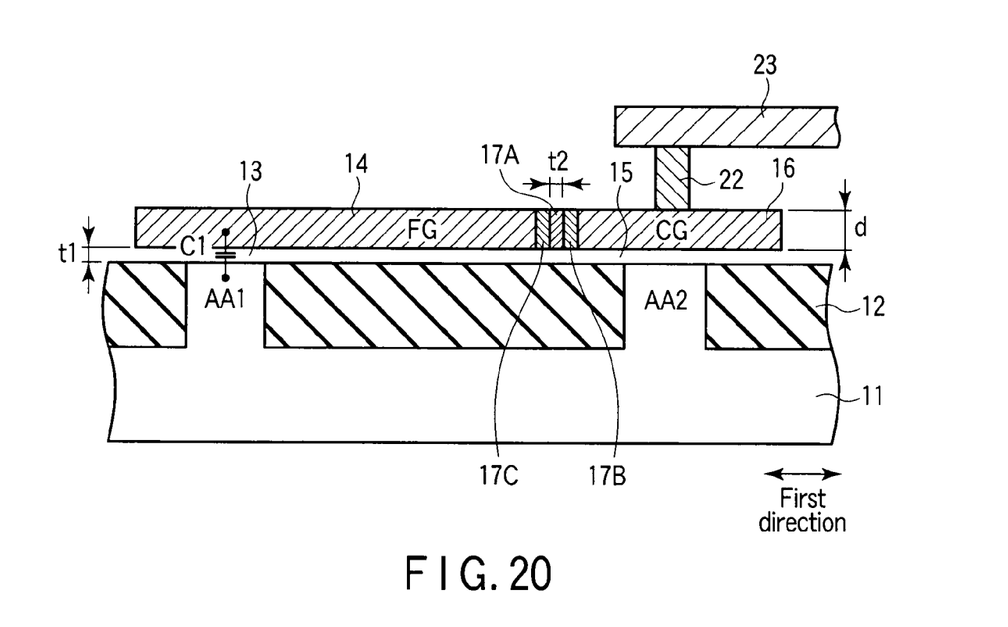
FIG. 20 is a cross-sectional view along a line XX-XX in FIG. 19.

FIG. 20 is a cross-sectional view along a line XX-XX in FIG. 19.

In this embodiment, since cross-sectional views corresponding to FIGS. 3 and 4 are the same as FIGS. 3 and 4, those views are omitted.

An element isolation insulating layer 12 with the STI structure is formed in a semiconductor substrate 11. First and second element regions (active areas) AA1 and AA2 are surrounded by the element isolation insulating layer 12, and, for example, disposed adjacent to each other in the first direction.

Diffusion layers 11A and 11B are formed in the first element region AA1. The conductivity type of the diffusion layers 11A and 11B is opposite to the conductivity type of the semiconductor substrate 11.

A floating gate 14 is formed above a channel region between the diffusion layers 11A and 11B. An area 13 between the first element region AA1 and the floating gate 14 is filled with a material or remains void.

A control gate electrode 16 is formed above the second element region AA2. An area 15 between the second element region AA2 and the control gate electrode 16 is filled with a material or remains void.

The floating gate 14 is disposed above the first element region AA1 and above the element isolation insulating layer 12 between the first and second element regions AA1 and AA2.

Regarding the width of the floating gate 14 in the second direction perpendicular to the first direction, the width on the first element region AA1 is L1, and the width in the part adjacent to the control gate electrode 16 is L2 (>L1).

The floating gate 14 and the control gate electrode 16 are adjacent to each other. An area between the floating gate 14 and the control gate electrode 16 is filled with a high-dielectric constant material (High-k material) 17A and insulating materials 17B and 17C.

The insulating materials 17B and 17C have a function of securing the reliability of both a junction surface between the high-dielectric constant material 17A and the floating gate 14 and a junction surface between the high-dielectric constant material 17A and the control gate electrode 16. The insulating materials 17B and 17C are comprised of an oxide film, a nitride oxide film, or an oxynitride film.

As with the first to fifth embodiments, the diffusion layer 11A is connected to a first bit line 19 through a contact plug 18. Meanwhile, the diffusion layer 11B is connected to a second bit line 21 through a contact plug 20. The control gate electrode 16 is connected to a word line 23 through a contact plug 22.

In the above single-layer polysilicon type, as with the fifth embodiment, the coupling ratio is rendered large by the high-dielectric constant material, whereby the writing/erasing efficiency is improved.

(7) Other

In the first to sixth embodiments, although the first and second element regions AA1 and AA2 are provided in the semiconductor substrate, the second element region AA2 can be omitted in any embodiment.

In this case, the second element region AA2 is replaced with the element isolation insulating layer 12.

Figure 21:
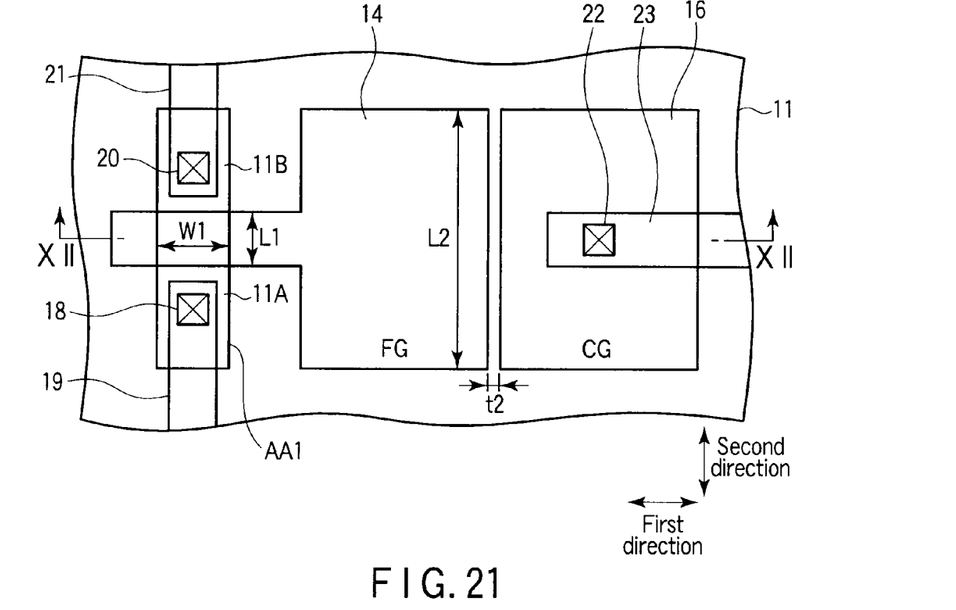
FIG. 21 is a plan view showing an aging device as a variation.
Figure 22:
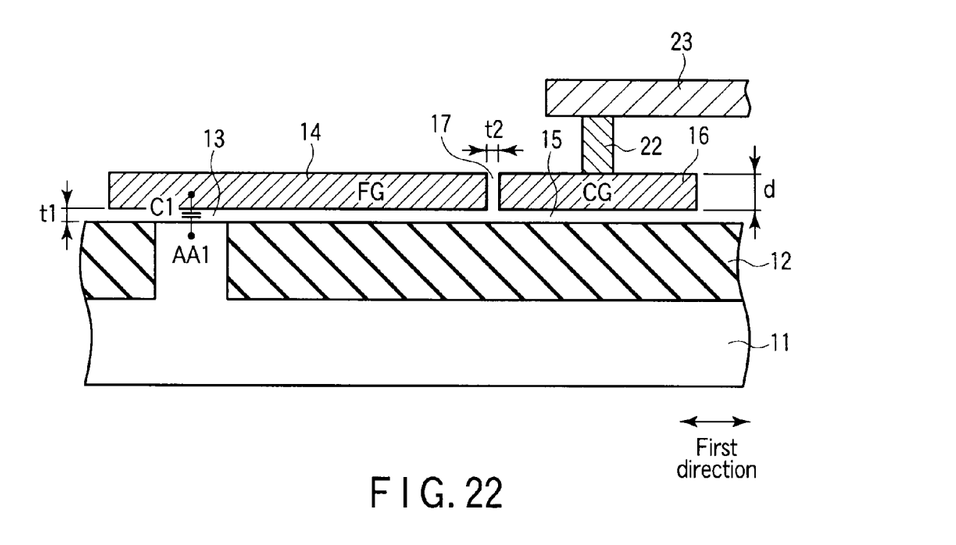
FIG. 22 is a cross-sectional view along a line XXII-XXII in FIG. 21.

For instance, in the first embodiment, as shown in FIGS. 21 and 22, the element isolation insulating layer 12 is disposed directly under the floating gate 14 in the region other than the first element region AA1, and the element isolation insulating layer 12 is disposed also directly under the control gate electrode 16.

In the second to sixth embodiments, the same modification is applicable.

3. Application

An aging device according to the invention can be applied to various semiconductor integrated circuits. In particular, in terms of processes, this aging device is promising for a non-volatile semiconductor memory having a single-layer polysilicon type memory cell.

Figure 23:
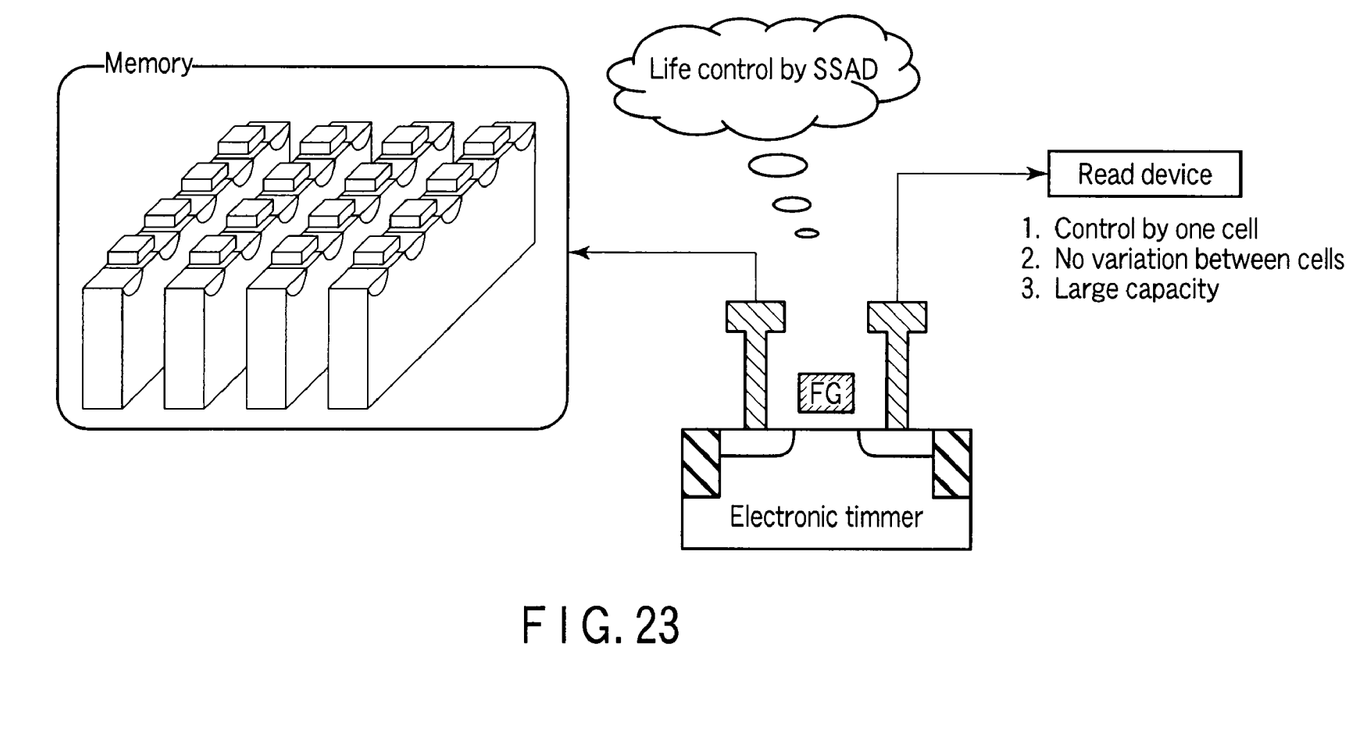
FIG. 23 is a view showing a system as an adoption example.

For instance, as shown in FIG. 23, the aging device of the invention is connected between a non-volatile semiconductor memory and a read device, and reading/writing of data is performed through the aging device of the invention, whereby a period allowing reading/writing of data can be controlled by the aging device.

When the above system is comprised, the life of the entire non-volatile semiconductor memory can be controlled by one aging device, whereby the variation in the life of each cell does not occur, and, at the same time, the invention can contribute to the increasing of the capacity of the non-volatile semiconductor memory.

4. Conclusion

According to the invention, an aging device suitable for high-speed writing/erasing can be realized.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An aging device comprising:
    a semiconductor substrate;
    an element isolation insulating layer provided in a surface region of the semiconductor substrate;
    a first element region with a width in a first direction, which is surrounded by the element isolation insulating layer;
    a second element region which is provided beside the first element region, wherein the second element region is surrounded by the element isolation insulating layer;
    first and second diffusion layers arranged in a second direction orthogonal to the first direction side by side in the first element region;
    a channel region provided between the first and second diffusion layers;
    a floating gate which is provided above the channel region and which extends in the first direction, wherein the floating gate is provided above the element isolation insulating layer between the first and second element regions; and
    a control gate electrode provided beside the floating gate with an interval in the first direction, wherein the control gate electrode is provided above the second element region,
    wherein a width in the second direction of the floating gate is wider in an area adjacent to the control gate electrode than an area above the first element region, and a coupling capacitance between the floating gate and the control gate electrode is larger than a coupling capacitance between the floating gate and the semiconductor substrate.

2. The aging device according to claim 1, wherein the floating gate extends from a first area on the first element region to a second area on the element isolation insulating layer, the width, in a direction perpendicular to a direction in which the floating gate extends, of the floating gate in the second area is larger than that of the floating gate in the first area.

3. The aging device according to claim 1, wherein the floating gate and the control gate electrode have concavities and convexities in a part where the floating gate and the control gate electrode are faced to each other.

4. The aging device according to claim 1, wherein a material or a void having a dielectric constant higher than a dielectric constant of a material or a void between the floating gate and the semiconductor substrate is provided between the floating gate and the control gate electrode.

5. The aging device according to claim 1, wherein an area of a part where the floating gate and the control gate electrode are faced to each other is larger than an area of a part where the first element region and the floating gate are faced to each other.

6. The aging device according to claim 1, wherein a high-dielectric constant material is provided between the floating gate and the control gate electrode.

7. The aging device according to claim 6, wherein the high-dielectric constant material is sandwiched with at least one of an oxide film, a nitride oxide film, and an oxynitride film.

8. The aging device according to claim 1, wherein the first diffusion layer is connected to a nonvolatile semiconductor memory, and the second diffusion layer is connected to a read device.

9. The aging device according to claim 8, wherein the nonvolatile semiconductor memory is comprised of a single-layer polysilicon type memory cell.

* * * * *